United States Patent
Uya et al.

(10) Patent No.: US 6,781,167 B2
(45) Date of Patent: Aug. 24, 2004

(54) SEMICONDUCTOR DEVICE AND ITS MANUFACTURE

(75) Inventors: Shinji Uya, Miyagi (JP); Tatsuya Hagiwara, Miyagi (JP)

(73) Assignee: Fuji Photo Film Co., Ltd., Nakanuma (JP)

( * ) Notice: Subject to any disclaimer, the term of this patent is extended or adjusted under 35 U.S.C. 154(b) by 0 days.

(21) Appl. No.: 10/615,875

(22) Filed: Jul. 10, 2003

(65) Prior Publication Data

US 2004/0031976 A1 Feb. 19, 2004

(30) Foreign Application Priority Data

Aug. 19, 2002 (JP) ........................................ 2002-238027

(51) Int. Cl.$^7$ ..................... H01L 27/148; H01L 29/768
(52) U.S. Cl. .................... 257/215; 257/223; 257/229; 257/249
(58) Field of Search ............................... 257/215–251, 257/291, 292

(56) References Cited

U.S. PATENT DOCUMENTS 5,621,230 A    4/1997  Guidash et al.
6,472,255 B1 * 10/2002  Hatano et al. .............. 438/144

* cited by examiner

Primary Examiner—Thien F Tran
(74) Attorney, Agent, or Firm—Arent Fox PLLC

(57) ABSTRACT

A CCD type solid state image pickup device having: a number of photoelectric conversion elements formed in and on the semiconductor substrate in a matrix configuration of rows and columns; a plurality of VCCDs each having a vertical channel region formed along each column of the photoelectric conversion elements, and charge transfer electrodes formed above the vertical channel region; an HCCD having a horizontal channel region coupled to one ends of the VCCDs, and charge transfer electrodes formed above the horizontal channel region; a floating diffusion formed in the semiconductor substrate and coupled to one end of the HCCD; and an input gate electrode of an output amplifier having a portion extending at least near to the floating diffusion, and the input gate electrode being thinner than the charge transfer electrodes.

4 Claims, 3 Drawing Sheets d5 < d2 ≒ d3

$d5 < d2 \doteq d3$

SEMICONDUCTOR DEVICE AND ITS MANUFACTURE

CROSS REFERENCE TO RELATED APPLICATION

This application is based on and claims priority of Japanese Patent Application No. 2002-238027 filed on Aug. 19, 2002, the entire contents of which are incorporated herein by reference.

BACKGROUND OF THE INVENTION

A) Field of the Invention

The present invention relates to a solid state image pickup device, and more particularly to a charge coupled device (CCD) type solid state image pickup device.

B) Description of the Related Art

Various types of solid state image pickup devices have been proposed. If a semiconductor substrate is used, photodiodes are mainly used as photoelectric conversion elements. Known methods of detecting electric charges accumulated in photodiodes are mainly a charge coupled device (CCD) type and a MOS type. The CCD type is suitable for detecting an instantaneous image simultaneity because charges of a plurality of pixels can be transferred simultaneously. The MOS type is suitable for low voltage drive.

As the number of pixels is increased in order to realize a high resolution, the size of a photoelectric conversion element becomes small so that the amount of charges capable of being accumulated in each element reduces. In order to obtain a sufficiently large output from the reduced charge amount, it is desired to increase the gain of an output amplifier.

FIG. 3A is a schematic plan view showing the structure of a CCD type solid state image pickup device. Photodiodes PD are disposed in a light reception area in a matrix configuration of rows and columns. Along each column of the photodiodes PD, a vertical charge transfer path VCCD is disposed. At one ends of the vertical charge transfer paths VCCD, a horizontal charge transfer path HCCD is disposed. To one end of the horizontal charge transfer path HCCD, a floating diffusion FD is coupled via an output gate OG. A light shielding film 12 of W or the like is disposed covering the vertical charge transfer paths VCCD and horizontal charge transfer path HCCD. The light shielding film 12 has openings 11 at the positions above photodiodes.

Charges accumulated in the photodiodes PD are read to the vertical charge transfer paths VCCD and vertically transferred in the vertical charge transfer paths VCCD, for example, by four-phase drive, toward the horizontal charge transfer path HCCD one row after another. Upon reception of charges of one row, the horizontal charge transfer path HCCD transfers the charges at high speed, for example, by two-phase drive H1 and H2, and supplies each signal charge via the output gate OG to the floating diffusion FD. The floating diffusion FD generates a voltage V=Q/C where C is the capacitance of the floating diffusion and Q is the amount of charge received. This voltage is applied to the gate of an output amplifier transistor which outputs an image signal.

FIG. 3B is a schematic diagram showing the structure of the vertical charge transfer path VCCD and horizontal charge transfer path HCCD. A channel region CH of, for example, an n-type, is formed in a semiconductor substrate. A gate insulating film GI is formed on the surface of the channel region CH. On the gate insulating film GI, transfer electrodes made of a first polysilicon layer P1 are formed at every second positions.

The surfaces of the first polysilicon transfer electrodes P1 are oxidized to form an insulating film I1. A second polysilicon layer is formed on the insulating layer I1 or GI and patterned to form second polysilicon transfer electrodes P2. In the horizontal charge transfer path HCCD, impurities are doped in a channel CH at every second electrode positions in order to form built-in potential wells and barriers.

The surfaces of the second polysilicon transfer electrodes P2 are also oxidized to form an insulating layer I2. A light shielding film 12 having a opening 11 at the position above each photodiode PD is formed above the polysilicon transfer electrodes, covering the vertical charge transfer paths VCCD and horizontal charge transfer path HCCD. Another insulating layer may be deposited on the insulating layer I2.

FIG. 3C is a schematic cross sectional view showing the region from the output end of the horizontal charge transfer path HCCD to the output amplifier.

In the horizontal charge transfer path HCCD, the first polysilicon transfer electrode P1 and one of its nearby second polysilicon transfer electrodes, P2, are connected in common and supplied with a drive signal H1 (H2). Adjacent to the final stage of the horizontal charge transfer path HCCD, in the example shown in FIG. 3C an output gate OG made of the second polysilicon layer is formed.

The floating diffusion FD includes a high impurity concentration n-type region 1 disposed for receiving charges from HCCD via the output gate OG, and the channel region CH surrounding the n-type region 1.

An output amplifier transistor is surrounded by a field oxide film 4, and a gate electrode 7 is formed traversing the channel region of the output amplifier transistor and extends near to the floating diffusion FD. An aluminum layer 3 electrically connects the gate electrode 7 and the high impurity concentration region 1 of the floating diffusion FD. The aluminum layer 3 is also used as the wiring lines for the charge transfer electrodes.

The gate electrode 7 is made of the same polysilicon layer as that of the polysilicon transfer electrodes and has generally the same thickness as that of the polysilicon transfer electrodes. Namely, d1≈d2≈d3 where d1 is a thickness of the gate electrode, d3 is a thickness of the first polysilicon transfer electrode P1 and d2 is a thickness of the second polysilicon transfer electrode P2. For example, the thickness of each polysilicon electrode is about 0.4 μm, and the size of the gate electrode 7 is 0.4 μm to 2 μm wide and 2 μm to 10 μm long.

In order to apply a high voltage to the gate electrode of the output amplifier when a predetermined amount of charges are accumulated in the floating diffusion FD, it is desired to reduce a parasitic capacitance of the floating diffusion FD. The capacitance can be reduced by reducing the areas of the floating diffusion FD and gate electrode 7. However, the reduction of parasitic capacitance is on the verge of limit.

SUMMARY OF THE INVENTION

An object of this invention is to provide a CCD type solid state image pickup device having an output amplifier with small parasitic capacitance.

According to one aspect of the present invention, there is provided a CCD type solid state image pickup device, comprising: a semiconductor substrate; a number of photoelectric conversion elements formed in and on the semiconductor substrate in a matrix configuration of rows and columns; a plurality of VCCDs each having a vertical channel region formed in the semiconductor substrate along each column of the photoelectric conversion elements, and a first set of charge transfer electrodes formed above the vertical channel region; an HCCD having a horizontal channel region formed in the semiconductor substrate and coupled to one ends of the VCCDs, and a second set of charge transfer electrodes formed above the horizontal channel region; a floating diffusion formed in the semiconductor substrate and coupled to one end of the HCCD; and an output amplifier including a pair of source/drain regions and an input gate electrode traversing above a region between the pair of source/drain regions, the input gate electrode having a portion extending at least near to the floating diffusion, and the input gate electrode being thinner than the first and second sets of charge transfer electrodes.

As the gate of the output transistor is made thin, the parasitic capacitance can be reduced so that the gain of the output amplifier can be increased.

DESCRIPTION OF THE PREFERRED EMBODIMENTS

Figure 1A:
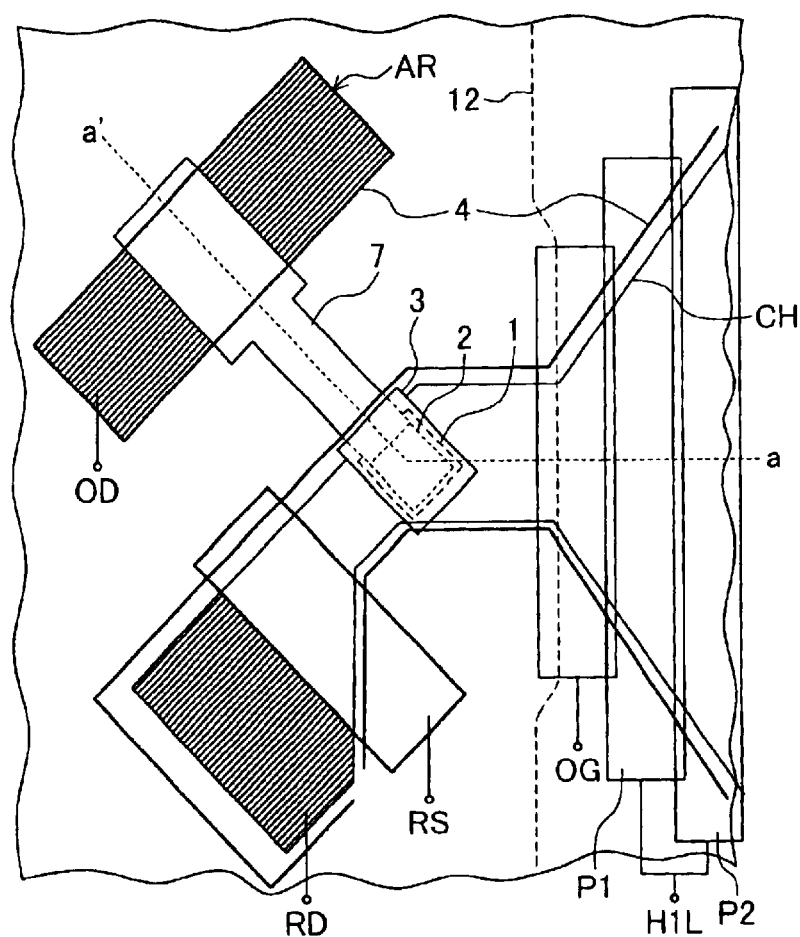
FIGS. 1A, 1B and 1C are a schematic plan view and schematic cross sectional views showing the structure of a CCD type solid state image pickup device according to an embodiment of the invention.
Figure 1B:
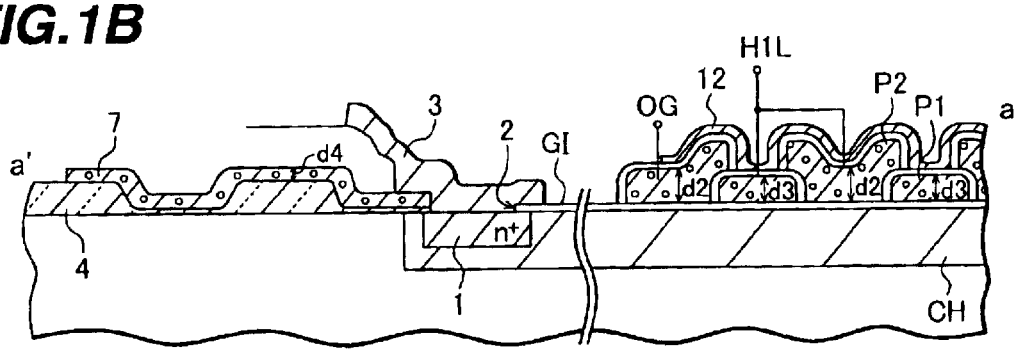

FIGS. 1A and 1B are a schematic plan view and a schematic cross sectional view showing the structure of the region near at an output amplifier of a CCD solid state image pickup device according to an embodiment of the invention. The structures of photodiodes PD, vertical charge transfer paths VCCD and a horizontal charge transfer path HCCD are similar to those described with reference to FIGS. 3A and 3B, the disclosure of which is incorporated herein by reference.

FIG. 1A is a schematic plan view showing the structure of the region from an output side of the horizontal charge transfer path HCCD to the output amplifier side, and FIG. 1B is a cross sectional view taken along line a–a' shown in FIG. 1A. A channel region CH of the horizontal charge transfer path HCCD gradually narrows its width, has eventually a constant width, and extends to surround a high impurity concentration region 1 of a floating diffusion FD. First polysilicon transfer electrodes P1 and second polysilicon transfer electrodes P2 are disposed above the channel region CH.

On the left side of the leftmost first polysilicon transfer electrode P1, an output gate OG is formed by using the second polysilicon layer. The n+-type high impurity concentration region 1 of the floating diffusion FD is formed in the channel region CH at the position spaced apart from the output gate OG by a predetermined distance. A silicon oxide layer GI on the surface of the silicon substrate has an opening 2 above the n+-type region 1 to expose this region 1.

An opening is formed through a field oxide film 4 at a position spaced apart from the channel region CH to define an active region AR for the output amplifier (transistor). The field oxide film 4 can be formed by depositing a silicon oxide film, for example, by chemical vapor deposition (CVD) and taper-etching this film. A gate electrode 7 of the output amplifier traverses the active region AR and extends near to the n+-type region 1 of the floating diffusion FD. An aluminum layer 3 extends from the upper surface of the gate electrode 7 to the exposed n+-type region 1 to electrically connect the gate electrode to the floating diffusion.

A reset transistor is formed in the region lower than the output amplifier as viewed in FIG. 1A in order to drain charges transferred to the floating diffusion FD. A reset gate RS is formed traversing the extended channel region. On the left side of the reset gate RS, a reset drain RD is formed. As a positive polarity voltage is applied to the reset drain RD and a positive polarity voltage is applied to the reset gate RS, charges in the floating diffusion are drained and cleared.

For example, the gate electrode 7 has a size of 0.4 $\mu$m to 2 $\mu$m wide and 2 $\mu$m to 10 $\mu$m long. As the parasitic capacitance of the floating diffusion, the capacitance of the gate electrode 7 is larger than the capacitance of the floating diffusion FD itself. The capacitance defined by the area of the gate electrode 7 facing the substrate and the capacitance defined by the side walls of the gate electrode 7 facing the peripheral area are relatively large.

As shown in FIG. 1B, in this embodiment, the polysilicon layer constituting the gate electrode 7 is formed independently from the transfer electrodes of the vertical charge transfer paths VCCD and horizontal charge transfer path HCCD, and the thickness d4 of the gate electrode 7 is made thin. For example, the thickness d4 of the gate electrode 7 is made as thin as $\frac{1}{3}$ or less of the thicknesses d2 and d3 of the transfer electrodes, for example, about $\frac{1}{4}$ or less.

Figure 1C:
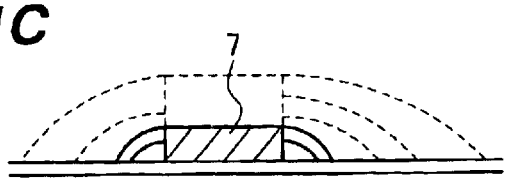

FIG. 1C is a cross sectional view illustrating the reduction of parasitic capacitance to be caused by the reduction of the thickness of the gate electrode 7. Broken lines represent the gate electrode and lines of electric force before thickness reduction, and solid lines represent the gate electrode 7 and lines of electric force after thickness reduction. The number of lines of electric force coupled between the side walls of the gate electrode 7 and the peripheral surface reduces as the height of the gate electrode 7 is lowered. Namely, the area of the side walls of the gate electrode facing the peripheral area reduces so that the parasitic capacitance of the gate electrode reduces. For example, assuming that the capacitance defined by the area of the gate electrode is approximately equal to the capacitance defined by the side walls of the gate electrode, by lowering the height of the gate electrode to $\frac{1}{4}$, the capacitance of the gate electrode is expected to be reduced to about $\frac{2}{3}$.

Figure 3A:
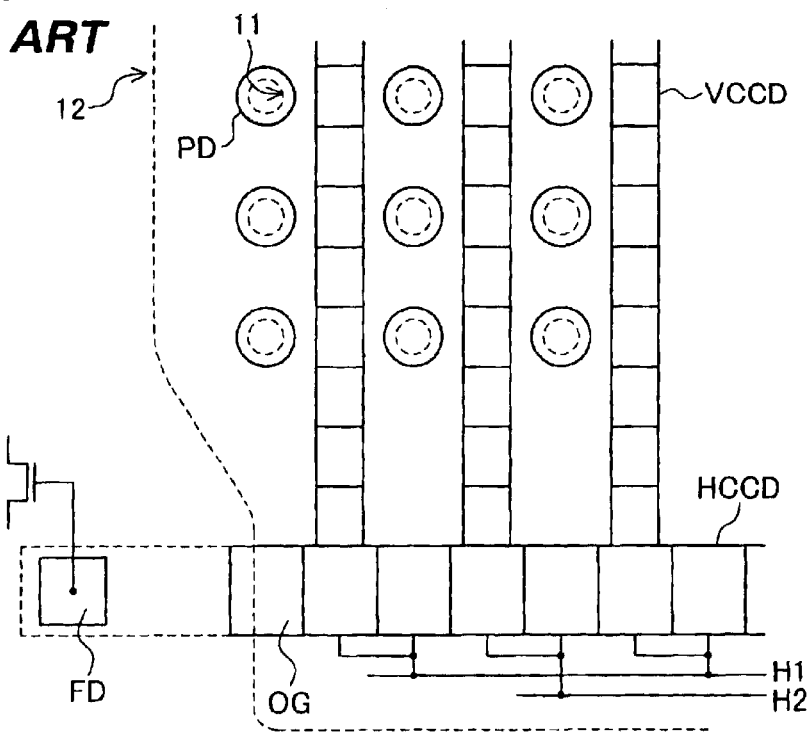
FIGS. 3A, 3B and 3C are a schematic plan view and schematic cross sectional views showing the structure of a CCD type solid state image pickup device according to related art.
Figure 3B:
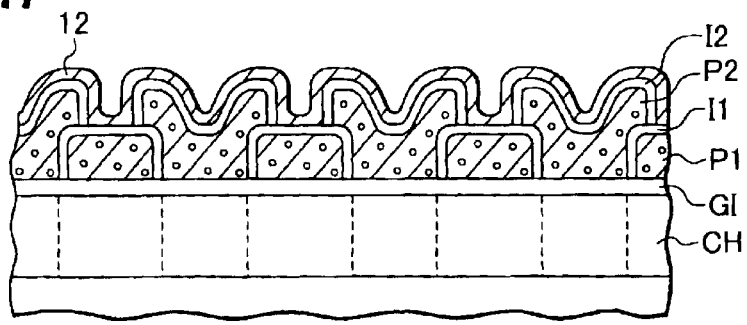
Figure 3C:
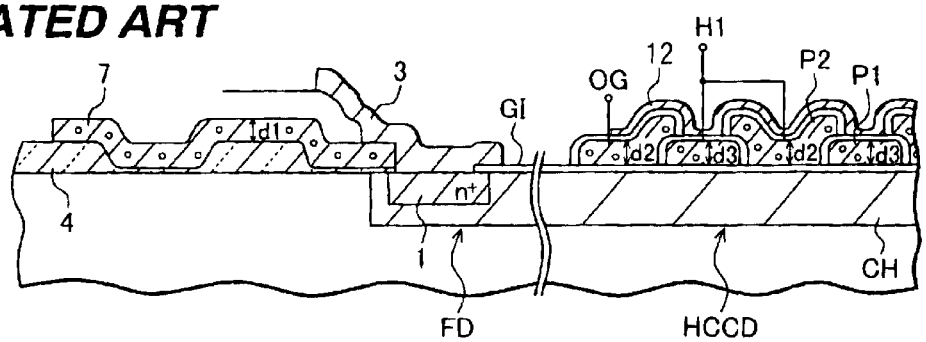

The layout of the photodiodes is not limited to the tetragonal configuration layout shown in FIG. 3A. The gate electrode 7 may be made of conductive material different from polysilicon. Other various changes are possible.

Figure 2A:
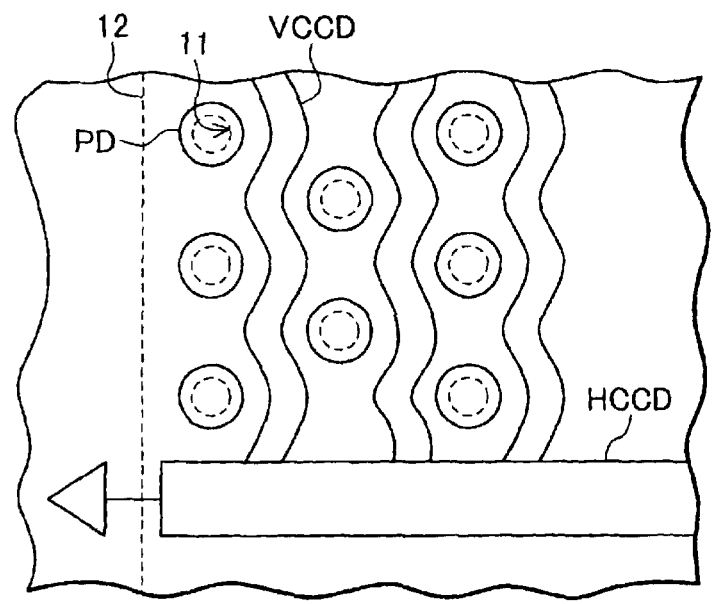
FIGS. 2A, 2B and 2C are a schematic plan view and schematic cross sectional views showing the structure of a CCD type solid state image pickup device according to another embodiment of the invention.
Figure 2B:
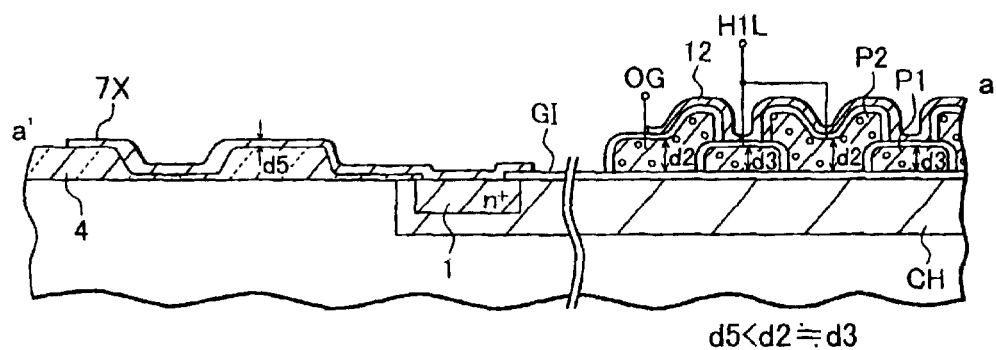

FIGS. 2A and 2B are a schematic plan view and a schematic cross sectional view showing the structure of a CCD type solid state image pickup device according to another embodiment of the invention.

FIG. 2A shows the structure of a honeycomb type CCD solid state image pickup device. Photodiodes PD of every second row and every second column are disposed at positions shifted by about a half pitch from every first row and every first column. A vertical charge transfer path VCCD is formed in a zigzag way along each photodiode PD column vertically as a whole. A horizontal charge transfer path HCCD is formed in a manner similar to that described with reference to FIG. 3A, the description of which is incorporated herein by reference.

FIG. 2B is a schematic cross sectional view showing the structure of the region near an output amplifier. On the right side in FIG. 2B, an output region of the horizontal charge transfer path HCCD is shown. The horizontal charge transfer path HCCD includes first polysilicon transfer electrodes P1 and second polysilicon transfer electrodes P2. Oxide films are formed on the surfaces of the first polysilicon transfer electrodes P1 and second polysilicon transfer electrodes P2. On these oxide films, a light shielding film 12 made of metal such as W is formed. The light shielding film 12 has an opening 11 above each photodiode PD.

Figure 2C:
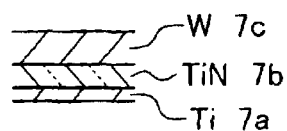

On the left side of FIG. 2B, the structure of the gate electrode of the output amplifier is shown. The gate electrode 7X is made of the same layer as the light shielding film 12. For example, as shown in FIG. 2C, the light shielding film 12 and gate electrode 7X are each made of a lamination structure of a Ti layer 7a, a TiN layer 7b and a W layer 7c. The thickness of each of the light shielding film 12 and gate electrode 7X is, for example, 150 nm to 300 nm, which is thinner than the thickness of the polysilicon transfer electrode, i.e. about 0.4 μm. As compared to the gate electrode made of the same conductive layer as the transfer electrodes, the capacitance can be reduced.

By making the gate electrode using the same layer as the light shielding film, the gate electrode having a small parasitic capacitance can be formed without increasing the number of manufacture processes.

The present invention has been described in connection with the preferred embodiments. The invention is not limited only to the above embodiments. It will be apparent to those skilled in the art that various modifications, improvements, combinations, and the like can be made.

What we claim are:

1. A CCD type solid state image pickup device, comprising:
    a semiconductor substrate;
    a number of photoelectric conversion elements formed in and on said semiconductor substrate in a matrix configuration of rows and columns;
    a plurality of VCCDs each having a vertical channel region formed in said semiconductor substrate along each column of said photoelectric conversion elements, and a first set of charge transfer electrodes formed above the vertical channel region;
    an HCCD having a horizontal channel region formed in said semiconductor substrate and coupled to one ends of said VCCDs, and a second set of charge transfer electrodes formed above the horizontal channel region;
    a floating diffusion formed in said semiconductor substrate and coupled to one end of said HCCD; and
    an output amplifier including a pair of source/drain regions and an input gate electrode traversing above a region between the pair of source/drain regions, the input gate electrode having a portion extending at least near to said floating diffusion, and the input gate electrode being thinner than the first and second sets of charge transfer electrodes.

2. A CCD type solid state image pickup device according to claim 1, further comprising a light shielding film covering said VCCDs and said HCCD, said light shielding film having an opening above each of said photoelectric conversion elements.

3. A CCD type solid state image pickup device according to claim 2, wherein said input gate electrode is made of a same film as said light shielding film.

4. A CCD type solid state image pickup device according to claim 2, wherein said input gate electrode is made of a polysilicon layer.

* * * * *